(12) United States Patent
Utsumi et al.

(10) Patent No.: US 11,693,044 B2
(45) Date of Patent: Jul. 4, 2023

(54) METHOD OF INSPECTING SILICON CARBIDE SEMICONDUCTOR DEVICE

(71) Applicant: FUJI ELECTRIC CO., LTD., Kawasaki (JP)

(72) Inventors: Makoto Utsumi, Matsumoto (JP); Masaki Miyazato, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 29 days.

(21) Appl. No.: 17/538,608

(22) Filed: Nov. 30, 2021

(65) Prior Publication Data

US 2022/0214392 A1 Jul. 7, 2022

(30) Foreign Application Priority Data

Jan. 5, 2021 (JP) ................. 2021-000361

(51) Int. Cl.
*G01R 31/26* (2020.01)
*H01L 29/16* (2006.01)
*H01L 27/02* (2006.01)

(52) U.S. Cl.
CPC ...... *G01R 31/2621* (2013.01); *H01L 27/0255* (2013.01); *H01L 29/1608* (2013.01)

(58) Field of Classification Search
CPC ............. H01L 27/0255; H01L 29/0623; H01L 29/0878; H01L 29/1095; H01L 29/1608; H01L 29/7813; H01L 29/7815; H01L 29/7805; G01R 31/2621; G01R 31/2831

See application file for complete search history.

(56) References Cited

U.S. PATENT DOCUMENTS

| 2017/0229356 A1* | 8/2017 | Niimura | G01R 31/2601 |
| 2020/0203166 A1* | 6/2020 | Terashima | H01L 29/32 |
| 2020/0292612 A1 | 9/2020 | Miyazato | |

FOREIGN PATENT DOCUMENTS

JP 2015-065250 A 4/2015
JP 2020-150181 A 9/2020

* cited by examiner

*Primary Examiner* — Son T Le
*Assistant Examiner* — Adam S Clarke
(74) *Attorney, Agent, or Firm* — Rabin & Berdo, P.C.

(57) ABSTRACT

A body diode is energized by inputting a BD energization pulse signal having a predetermined cycle. At the start of energization of the body diode and immediately before termination thereof, an ON signal of a Von measurement pulse signal is input to a high-temperature semiconductor chip at a timing different from that of an ON signal of the BD energization pulse signal, thereby passing a drain-source current through a MOSFET, and a drain-source voltage is measured. Thereafter, energization of the body diode is terminated. At room temperature before and after the energization of the body diode, the drain-source voltage is measured by inputting the ON signal of the Von measurement pulse signal. A semiconductor chip for which a fluctuation amount of the drain-source voltage at a high temperature and a fluctuation amount of the drain-source voltage at room temperature are within predetermined ranges is determined to be a conforming product.

7 Claims, 7 Drawing Sheets

FIG.1A

WHEN MOSFET IS ON

FIG.1B

WHEN BD IS ENERGIZED

METHOD OF INSPECTING SILICON CARBIDE SEMICONDUCTOR DEVICE

CROSS REFERENCE TO RELATED APPLICATIONS

This application is based upon and claims the benefit of priority of the prior Japanese Patent Application No. 2021-000361, filed on Jan. 5, 2021, the entire contents of which are incorporated herein by reference.

BACKGROUND OF THE INVENTION

1. Field of the Invention

Embodiments of the invention relate to a method of inspecting a silicon carbide semiconductor device.

2. Description of the Related Art

In a MOS type silicon carbide (SiC) semiconductor device having a MOS gate (insulated gate having a 3-layer structure including a metal, an oxide film, and a semiconductor), it is conventionally known that stacking faults grow due to energization of a parasitic pn diode (body diode (BD)) formed by a pn junction between a p-type base region and an n-type drift region and resistance increases in portions where stacking faults have grown, whereby current does not flow easily and ON voltage Von increases.

For example, in a semiconductor circuit device configured by a combination of MOS type silicon carbide semiconductor devices (semiconductor chips), it becomes difficult for current to flow through a semiconductor chip in which stacking faults have grown and to an extent that it becomes difficult for current to flow through the semiconductor chip, the amount of current that flows through other semiconductor chips connected in parallel to said semiconductor chip becomes relatively large. As a result, the current load for each semiconductor chip varies from design conditions and reliability of the semiconductor circuit device may decrease.

To prevent adverse effects on the semiconductor circuit devices, caused by fluctuation of the ON voltage Von of the MOS type silicon carbide semiconductor devices (semiconductor chips) due to such stacking faults, a commonly known method of inspection includes pre-energizing the body diodes prior to shipping of the semiconductor chips and measuring the ON voltage Von of the MOS type semiconductor devices or forward voltage Vf of the body diodes before and after energizing the body diodes to thereby, screen (identify) semiconductor chips having a large amount of fluctuation.

As a conventional method of inspecting a silicon carbide semiconductor device, a method has been proposed in which a pulsed current is passed through a body diode (the body diode is energized), acceleration of the MOS type silicon carbide semiconductor device is degraded, stacking faults are grown, and ON resistance of the body diode is measured before and after the pulsed current is passed, whereby it is judged whether the MOS type silicon carbide semiconductor device is a conforming product or a defective product based on the rate of increase of the ON resistance of the body diode after the pulsed current is passed through the body diode (for example, refer to Japanese Laid-Open Patent Publication No. 2015-065250).

Further, as another conventional method of inspecting a silicon carbide semiconductor device, a method has been proposed in which forward current is passed through a body diode (the body diode is energized), stacking faults are grown, ON voltage of the MOS type silicon carbide semiconductor device is measured before and after energization of the body diode, and when the rate of change of the ON voltage measured before and after energization of the body diode is less than 3%, the MOS type silicon carbide semiconductor device is determined to be a conforming product (for example, refer to Japanese Laid-Open Patent Publication No. 2020-150181).

SUMMARY OF THE INVENTION

According to an embodiment of the invention, a method of inspecting a silicon carbide semiconductor device having a semiconductor chip containing silicon carbide; a first semiconductor region of a first conductivity type, provided in the semiconductor chip; a second semiconductor region of a second conductivity type, provided between a first surface of the semiconductor chip and the first semiconductor region; a plurality of third semiconductor regions of the first conductivity type, each selectively provided between the first surface of the semiconductor chip and the second semiconductor region; a gate insulating film provided in contact with a portion of the second semiconductor region between the first semiconductor region and one of the third semiconductor regions; a gate electrode provided on the second semiconductor region via the gate insulating film; a first electrode electrically connected to the second semiconductor region and the third semiconductor regions; and a second electrode provided on a second surface of the semiconductor chip, includes: energizing a parasitic diode by inputting a first pulse signal having a first duty cycle, as a first process, the parasitic diode being formed by a pn junction between the second semiconductor region and the first semiconductor region; passing a predetermined first current through the semiconductor chip in a direction from the second electrode to the first electrode by inputting a second pulse signal, and measuring a first voltage applied to the second electrode and positive with respect to the first electrode while the second pulse signal is ON, as a second process; terminating input of the first pulse signal, thereby terminating energization of the parasitic diode, as a third process; calculating, as a fourth process, a first difference between two measured values of the first voltage obtained at different times after the first process but before the third process, by performing the second process on the semiconductor chip, the semiconductor chip having generated heat due to the first process; and identifying the semiconductor chip for which the first difference is within a first predetermined range to be a conforming product, as a fifth process.

Objects, features, and advantages of the present invention are specifically set forth in or will become apparent from the following detailed description of the invention when read in conjunction with the accompanying drawings.

DETAILED DESCRIPTION OF THE INVENTION

First, problems associated with the conventional techniques described above are discussed. In Japanese Laid-Open Patent Publication No. 2015-065250 and Japanese Laid-Open Patent Publication No. 2020-150181, to confirm fluctuation of characteristics of the MOS type silicon carbide semiconductor device (semiconductor chip) before and after energization of the body diode, ON voltage measurement (or ON resistance measurement), body diode energization, and ON voltage measurement (or ON resistance measurement) has to be sequentially performed. ON voltage measurement and body diode energization are performed by respectively different inspection apparatus and therefore, the number of screening inspection processes increases, leading to cost increases. Therefore, it is desirable to establish a method to perform, by the fewest number of processes possible, screening inspection of semiconductor chips in which the ON voltage fluctuates when a body diode is energized.

Embodiments of a method of inspecting a silicon carbide semiconductor device according to the present invention is described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 1A:
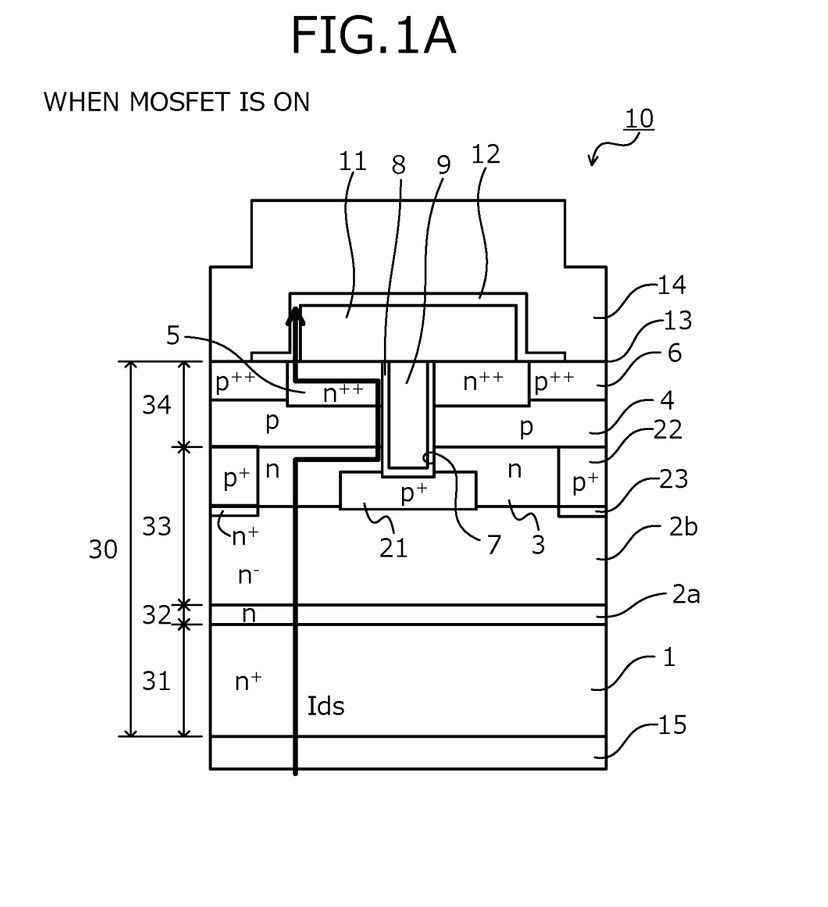
FIG. 1A is a cross-sectional view depicting a state of a silicon carbide semiconductor device according to an embodiment during operation.
Figure 1B:
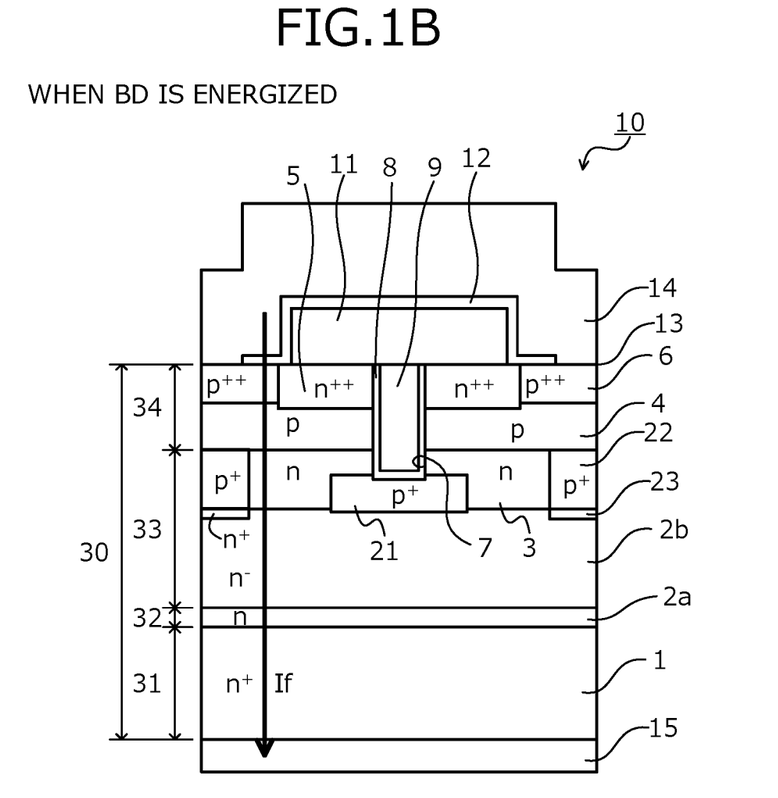
FIG. 1B is a cross-sectional view depicting another state of the silicon carbide semiconductor device according to the embodiment during operation.

While a method of inspecting a silicon carbide semiconductor device according to an embodiment is described taking, as an example, a metal oxide semiconductor field effect transistor (MOSFET) having an insulated gate having a 3-layer structure including a metal (gate electrode), an oxide film (gate insulating film), and a semiconductor, application to other MOS type silicon carbide semiconductor devices having a MOS gate is similarly possible. FIGS. 1A and 1B are cross-sectional views depicting states of the silicon carbide semiconductor device according to the embodiment during operation. FIGS. 1A and 1B respectively depict a state when the MOSFET is ON and a state when the body diode (BD) is energized.

First, a structure of the silicon carbide semiconductor device according to the embodiment is described. A silicon carbide semiconductor device 10 according to the embodiment depicted in FIGS. 1A and 1B is a vertical MOSFET having MOS gates on a front side of a semiconductor substrate (semiconductor chip) 30 that contains silicon carbide (SiC). In the semiconductor substrate 30, epitaxial layers 32, 33, 34 respectively constituting an n-type buffer region $2a$, an n$^-$-type drift region (first semiconductor region) $2b$, and a p-type base region (second semiconductor region) 4 are sequentially formed by epitaxial growth on a front surface of the n$^+$-type starting substrate 31 containing silicon carbide. The semiconductor substrate 30 has a first main surface and a second main surface opposite to each other, the first main surface having the p-type epitaxial layer 34 and assumed to be a front surface and the second main surface having the n$^+$-type starting substrate 31 and assumed to be a back surface.

The n$^+$-type starting substrate 31 is an n$^+$-type drain region 1. The n-type buffer region $2a$ may have a 2-layer structure in which an n-type low-concentration epitaxial layer and an n-type high-concentration epitaxial layer having an impurity concentration higher than an impurity concentration of the n-type low-concentration epitaxial layer are sequentially stacked on the n$^+$-type starting substrate 31. Holes (positive holes) generated at a pn junction interface between the p-type base region 4 and the n$^-$-type drift region $2b$ are recombined in the n-type buffer region $2a$, and the n-type buffer region $2a$ has a function of preventing the holes from reaching the n$^+$-type starting substrate 31. The growth of stacking faults in the epitaxial layers 32, 33, 34, from the n$^+$-type starting substrate 31 may be prevented by the n-type buffer region $2a$.

The n-type buffer region $2a$ may be omitted. In an instance in which the n-type buffer region $2a$ is omitted, an n$^-$-type epitaxial layer 33 constituting the n$^-$-type drift region $2b$ is epitaxially grown on the front surface of the n$^+$-type starting substrate 31. The n$^-$-type drift region $2b$ is a portion of the n$^-$-type epitaxial layer 33, other than a later-described n-type current spreading region 3, first and second p$^+$-type regions 21, 22, and n$^+$-type regions 23. The n$^-$-type drift region $2b$ is provided between and in contact with the n-type buffer region $2a$ and the n-type current spreading region 3, the first and the second p$^+$-type regions 21, 22, and the n$^+$-type regions 23.

The p-type base region 4 is a portion of the p-type epitaxial layer 34, other than later-described n$^{++}$-type source regions (third semiconductor regions) 5 and later-described p$^{++}$-type contact regions 6. The p-type base region 4 is provided between the front surface of the semiconductor substrate 30 and the n$^-$-type drift region $2b$. The n-type current spreading region 3 that is a so-called current spreading layer (CSL) and that reduces carrier spreading resistance may be provided between and in contact with the n$^-$-type drift region $2b$ and the p-type base region 4. The n-type current spreading region 3 reaches a deep position closer to the n$^+$-type drain region 1 than are bottoms of later described trenches 7.

The MOS gates are trench gate structures configured by the p-type base region 4, the n$^{++}$-type source regions 5, the p$^{++}$-type contact regions 6, the trenches 7, gate insulating films 8, and gate electrodes 9, and are disposed for each unit cell (functional unit of a device element) of the MOSFET. The n$^{++}$-type source regions 5 and the p$^{++}$-type contact regions 6 are selectively provided between the front surface of the semiconductor substrate 30 and the p-type base region 4 to be in contact with the p-type base region 4 and exposed at the front surface of the semiconductor substrate 30. Being exposed at the front surface of the semiconductor substrate 30 means being in contact with later-described source electrodes 13 in contact holes of a later-described interlayer insulating film 11.

The p$^{++}$-type contact regions 6 may be omitted. in this case, instead of the p$^{++}$-type contact regions 6, the p-type base region 4 is exposed at the front surface of the semiconductor substrate 30. The first and the second p+-type regions 21, 22 and the n+-type regions 23 are disposed at deep positions closer to the n+-type drain region 1 than are the bottoms of the trenches 7. The first and the second p+-type regions 21, 22 have a function of mitigating electric field applied to the bottoms of the trenches 7. The first p+-type regions 21 are provided separate from the p-type base region 4 and respectively face the bottoms of the trenches 7 in depth direction. The first p+-type regions 21 may be electrically connected to the source electrodes 13 in a non-depicted portion.

The first p+-type regions 21 may respectively surround the bottoms of the trenches 7 and may be exposed at the bottoms of the trenches 7. Being exposed at the bottoms of the trenches 7 means being in contact with the gate insulating films 8 at the bottoms of the trenches 7. The second p+-type regions 22 are respectively provided between an adjacent two of the trenches 7, apart from the first p+-type regions 21 and the trenches 7, and in contact with the p-type base region 4. The n+-type regions 23 are provided between and in contact with the n−-type drift region 2b and the second p+-type regions 22. Due to the n+-type regions 23, a breakdown voltage secured by the first p+-type regions 21 at the bottoms of the trenches 7 is higher than a breakdown voltage secured by the second p+-type regions 22 respectively between an adjacent two of the trenches 7.

The trenches 7 penetrate through the n++-type source regions 5 and the p-type base region 4, and reach the n-type current spreading region 3 (in an instance in which the n-type current spreading region 3 is not provided, the n−-type drift region 2b). In the trenches 7, the gate electrodes 9 are provided via the gate insulating films 8, respectively. The gate electrodes 9 of all of the unit cells are electrically connected to a gate pad (electrode pad: not depicted). The interlayer insulating film 11 covers the gate electrodes 9. In an entire area between a surface of the interlayer insulating film 11 and a surface of a later-described source pad (first electrode) 14, for example, a barrier metal 12 that prevents diffusion of metal atoms from the source pad 14 to the gate electrodes 9 may be provided.

The source electrodes 13 are in contact with the n++-type source regions 5 and the p++-type contact regions 6 (in an instance in which the p++-type contact regions 6 are not provided, the p-type base region 4) exposed in the contact holes of the interlayer insulating film 11, and are electrically connected to the p-type base region 4, the n++-type source regions 5, and the p++-type contact regions 6. The source pad (electrode pad) 14 is provided in substantially an entire area of the front surface of the semiconductor substrate 30 so as to be embedded in the contact holes of the interlayer insulating film 11. A drain electrode (second electrode) 15 is provided in an entire area of the back surface (back surface of the n+-type starting substrate 31) of the semiconductor substrate 30 and is electrically connected to the n+-type drain region 1 (the n+-type starting substrate 31).

Operation of the silicon carbide semiconductor device 10 according to the embodiment is described. When voltage (drain-source voltage Vds) that is positive with respect to the source pad 14 is applied to the drain electrode 15 and gate voltage at least equal to a gate threshold voltage is applied to the gate electrodes 9, channels (n-type inversion layer) are formed in portions of the p-type base region 4 along the trenches 7. As a result, drain-source current Ids flows from the n+-type drain region 1 and through the n-type buffer region 2a, the n−-type drift region 2b, and the channels to the n++-type source regions 5, whereby the MOSFET (the silicon carbide semiconductor device 10) turns ON (FIG. 1A).

On the other hand, when voltage that is positive with respect to the source pad 14 is applied to the drain electrode 15 and the gate voltage that is less than the gate threshold voltage is applied to the gate electrodes 9, pn junctions between the first and the second p+-type regions 21, 22, the p-type base region 4, the n-type current spreading region 3, the n+-type regions 23, the n−-type drift region 2b, and the n-type buffer region 2a are reverse biased, whereby the drain-source current Ids stops flowing and the MOSFET maintains an OFF state. A depletion layer spreads from the pn junctions, and electric field applied to the gate insulating films 8 at the bottoms of the trenches 7 positioned closer to the source electrodes 13 than are the pn junctions is mitigated.

Further, when the MOSFET is OFF, voltage (the forward voltage Vf of the body diodes) that is negative with respect to the source pad 14 is applied to the drain electrode 15, whereby forward current If flows through parasitic pn diodes (body diodes (BDs)) formed by the pn junctions between the first and the second p+-type regions 21, 22, the p-type base region 4, the n-type current spreading region 3, the n+-type regions 23, the n−-type drift region 2b, and the n-type buffer region 2a (FIG. 1B). As described above, when stacking faults grow in the semiconductor substrate 30 when the forward current If flows through the body diodes of the MOSFET (during BD energization), the ON voltage Von of the MOSFET increases.

Thus, a screening inspection that includes pre-energizing the body diodes before product shipping, and screening (identifying) semiconductor chips for which the ON voltage Von of the MOSFET does not fluctuate is performed so that the ON voltage Von of the MOSFET does not fluctuate due to energization of the body diodes when the silicon carbide semiconductor device 10 according to the embodiment (semiconductor chip: product) is used. The ON voltage Von MOSFET is a lower limit of the drain-source voltage Vds necessary to turn ON the MOSFET. Next, a method of inspecting (method of screening inspection for) the silicon carbide semiconductor device 10 according to the embodiment is described.

Figure 2:
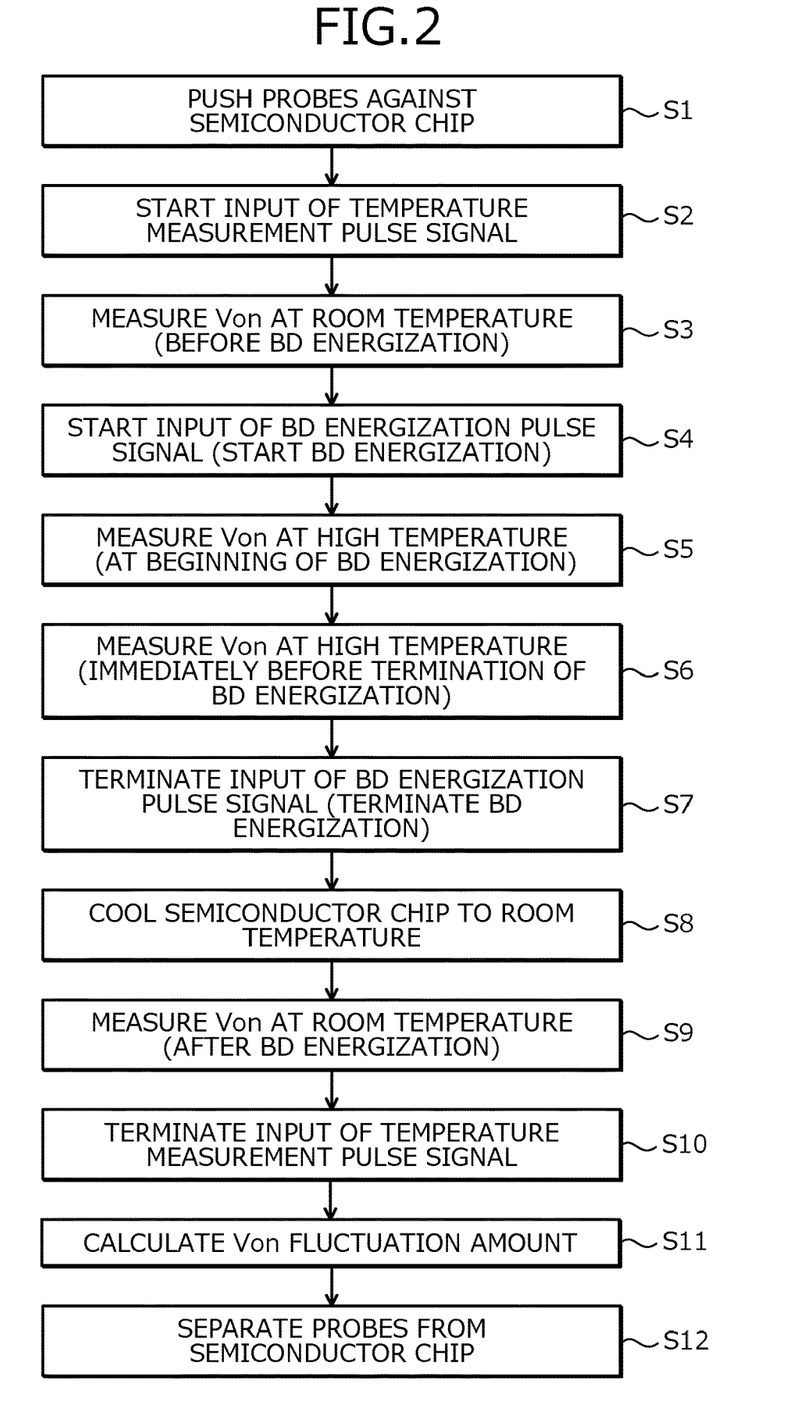
FIG. 2 is a flowchart of a method of inspecting the silicon carbide semiconductor device according to the embodiment.
Figure 3:
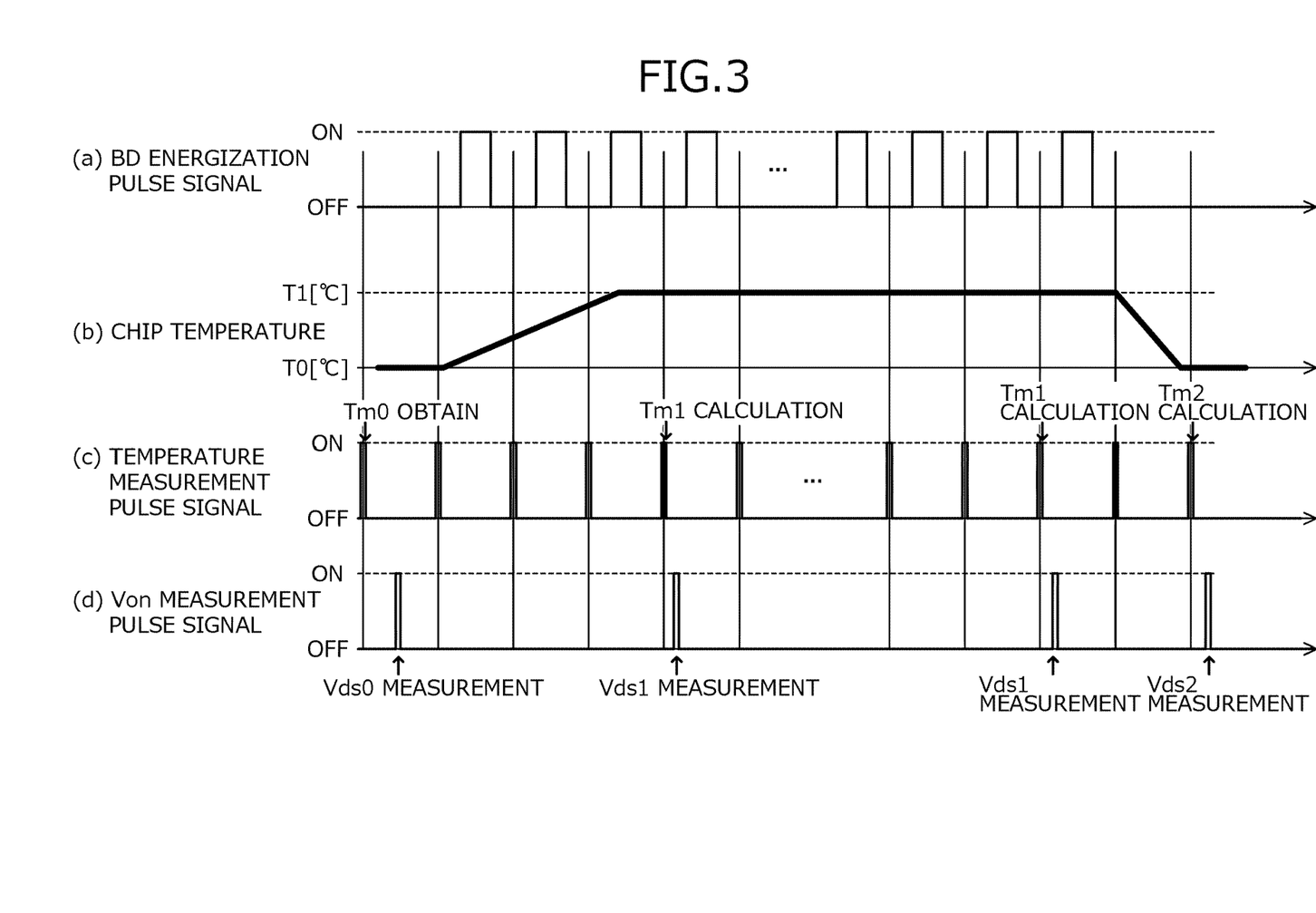
FIG. 3 is a waveform diagram of waveforms of current that flows through the silicon carbide semiconductor device according to the embodiment during an inspection in FIG. 2.

FIG. 2 is a flowchart of the method of inspecting the silicon carbide semiconductor device according to the embodiment. FIG. 3 is a waveform diagram of waveforms of current that flows through the silicon carbide semiconductor device according to the embodiment during the inspection in FIG. 2. As depicted in FIG. 2, in the method of inspecting the silicon carbide semiconductor device according to the embodiment, first, the semiconductor substrate (semiconductor chip) 30 on which the silicon carbide semiconductor device 10 according to the embodiment is fabricated (manufactured) is placed on a conductive stage (not depicted) of an inspection apparatus, with the back surface of the semiconductor substrate 30 facing the stage. As a result, the drain electrode 15 on the back surface of the semiconductor substrate 30 is connected to a measuring device (tester: not depicted).

Next, different probes (not depicted) are each pushed in plural against the source pad 14 and the gate pad (not depicted) of the semiconductor substrate 30 on the stage (or the electrode pad is pushed against the probes), and these electrode pads are electrically connected to the measuring device via the probes (step S1). A set of input\output terminals is configured by these probes and stage. The probes connected to the source pad 14 and the gate pad may include a sensing probe connected to an electrode pad of a sensing device element (not depicted) for protecting/controlling the MOSFET (refer to FIGS. 1A and 1B) that constitutes a main device element.

Next, input of a temperature measurement pulse signal (second pulse signal) ((c) in FIG. 3) is started (step S2). The temperature measurement pulse signal suffices to turn ON (input of ON signal) at an OFF timing (input of OFF signal) of a later-described BD energization pulse signal (first pulse signal) ((a) in FIG. 3) and at an OFF timing of a later-described Von measurement pulse signal (third pulse signal) ((d) in FIG. 3). The temperature measurement pulse signal may be either a single pulse or a continuous pulse. In an instance in which the temperature measurement pulse signal is a single pulse, at a predetermined timing, an ON signal that is 1 cycle of the temperature measurement pulse signal is input. In an instance in which the temperature measurement pulse signal is a continuous pulse, the temperature measurement pulse signal is continually turned ON and OFF at a predetermined cycle (second duty cycle).

In an instance in which a current sensor for the main device element is provided on the semiconductor substrate 30, the temperature measurement pulse signal is input to the current sensor via the sensing probe and as described hereinafter, a temperature Tm of the semiconductor substrate 30 may be calculated by the forward voltage Vf of a body diode of the current sensor. In this instance, the BD energization pulse signal and the Von measurement pulse signal are input to the main device element via remaining probes other than the sensing probe. Therefore, ON timing (second time) of the temperature measurement pulse signal may overlap ON timing (first time) of the BD energization pulse signal or overlap ON timing (third time) of the Von measurement pulse signal, thereby enhancing the degrees of freedom of design.

Further, in an instance in which a temperature sensor for the main device element is provided on the semiconductor substrate 30, instead of a later-described method of calculating the temperature Tm of the semiconductor substrate 30, the temperature Tm of the semiconductor substrate 30 may be measured using the temperature sensor. The current sensor is a MOSFET structured similarly to the main device element. The current sensor is connected in parallel to the main device element, operates under same conditions as those of the main device element, and has a function of detecting overcurrent (OC) flowing in the main device element. The temperature sensor is a diode and has a function of detecting the temperature of the MOSFET that is a main device element, by using diode temperature characteristics.

The temperature measurement pulse signal is a signal for calculating the temperature Tm of the semiconductor substrate 30. When the MOSFET is in the OFF state, the ON signal of the temperature measurement pulse signal is input between the source pad 14 and the drain electrode 15 via the probes, and for a duration (ON pulse width) of the ON signal of the temperature measurement pulse signal, the forward current If flows through the body diode. The forward voltage Vf of the body diode at this time is obtained as a voltage Vm1 applied to the semiconductor substrate 30 at the time of input of the ON signal of the temperature measurement pulse signal. The temperature Tm of the semiconductor substrate 30 is calculated by equation (1) below, using a temperature characteristic (the forward voltage Vf decreases when the temperature increases) of a diode.

$$Tm = T0 + (Vm0 - Vm1) \times \alpha \quad (1)$$

In equation (1), Tm is the temperature of the semiconductor substrate 30. T0 is a stage temperature before body diode energization. Vm0 and Vm1 are voltages applied to the semiconductor substrate 30 by the input of the ON signal of the temperature measurement pulse signal before body diode energization and during body diode energization, respectively. α is a temperature a body diode temperature coefficient, obtained before the screening inspection. The temperature Tm of the semiconductor substrate 30 suffices to be calculated at least once before body diode energization (at room temperature (RT)), at the beginning of the body diode energization (at a high temperature), immediately before termination of the body diode energization (at a high temperature), and after the body diode energization (at room temperature), and needs not be checked continuously.

In particular, the temperature Tm of the semiconductor substrate 30 suffices to be calculated at least once near a process (Von measurement) at later-described step S3, step S5, step S6, and step S9 (for example, timing immediately before Von measurements indicated as Tm0, Tm1, and Tm2 in (c) in FIG. 3. As a result, transition of the temperature Tm of the semiconductor substrate 30 between the process at step S2 to a process at later-described step S12 may be obtained ((b) in FIG. 3). In (c) in FIG. 3, a state in which the temperature measurement pulse signal is input at a predetermined cycle (continuous pulse) is depicted. In this instance, the temperature Tm of the semiconductor substrate 30 may be calculated each time the temperature measurement pulse signal is ON.

In an instance in which the ON signal of the temperature measurement pulse signal is input only when the temperature Tm of the semiconductor substrate 30 is calculated (the temperature measurement pulse signal is assumed to be a single pulse), for example, input of the ON signal of the temperature measurement pulse signal and calculation of the temperature Tm of the semiconductor substrate 30 each suffices to be performed between the process at step S1 and the process at step S3, between the process at step S4 and the process at step S5, between the process at step S5 and the process at step S6, and between the process at step S8 and the process at step S9, instead of at the process (start of input of the temperature measurement pulse signal) at step S2 and at the process (termination of input of the temperature measurement pulse signal) at step S12.

To turn OFF the MOSFET when the ON signal of the temperature measurement pulse signal is input, gate voltage Vg that is lower than the gate threshold voltage suffices to be applied to the gate pad. Preferably, gate voltage Vg that is negative (for example, Vg=−10V) may be applied to the gate pad to completely turn OFF the MOSFET. A strength (amplitude) of the temperature measurement pulse signal is set to be a strength by which the temperature Tm of the semiconductor substrate 30 does not rise due to the input of the ON signal of the temperature measurement pulse signal. In particular, the strength of the temperature measurement pulse signal, for example, is a strength by which forward current If that is about 1/1000 of the rated current flows through the body diode due to the input of the ON signal of the temperature measurement pulse signal.

Herein, an instance in which the temperature Tm of the semiconductor substrate 30 is measured at a timing immediately before Von measurement is described as an example. First, the stage temperature T0 is obtained as the temperature Tm of the semiconductor substrate 30 before body diode energization. The stage temperature T0 corresponds to room temperature (for example, about 25 degrees C.). In addition to this, as described above, the ON signal of the temperature measurement pulse signal has a predetermined strength and is input while the MOSFET is OFF, a predetermined forward current If (set current) flows through the body diode, the forward voltage Vf of the body diode at this time is measured, and the forward voltage Vf is obtained as the voltage Vm0 that is applied to the semiconductor substrate 30 before body diode energization.

Next, the ON voltage Von of the MOSFET before body diode energization (at room temperature) is measured (step S3). In the process at step S3, as the ON voltage Von of the MOSFET, the drain-source voltage Vds0 of the MOSFET before body diode energization is measured. Measurement variability of the drain-source voltage Vds of the MOSFET is less than measurement variability of the forward voltage Vf of the body diode (refer to FIGS. 4 to 6). Therefore, as the ON voltage Von of the MOSFET, the drain-source voltage Vds of the MOSFET is measured, whereby screening accuracy may be enhanced.

In particular, in a state in which gate voltage Vg that is at least equal to the gate threshold voltage (for example, Vg=+15V) is applied to the gate pad, an ON signal of the Von measurement pulse signal ((d) in FIG. 3) having the predetermined strength is input between the source pad 14 and the drain electrode 15 via the probes, for the duration (the ON pulse width) of the ON signal of the Von measurement pulse signal, and the predetermined drain-source current Ids (set current) flows through the MOSFET. The drain-source voltage Vds0 of the MOSFET at this time is measured, whereby the drain-source voltage Vds0 is obtained as the ON voltage Von of the MOSFET before body diode energization.

The Von measurement pulse signal may turn ON at a timing (third time) when the BD energization pulse signal is OFF and at a timing when the temperature measurement pulse signal is OFF, and may be either a single pulse or a continuous pulse. In an instance in which the Von measurement pulse signal is a single pulse, at a predetermined timing, the ON signal is input for one cycle of the Von measurement pulse signal. In an instance in which the Von measurement pulse signal is a continuous pulse, the Von measurement pulse signal is continuously ON (input of ON signal)/OFF (input of OFF signal) for a predetermined cycle (third duty cycle). In (d) in FIG. 3, a state in which the ON signal of the Von measurement pulse signal is input at a predetermined timing (single pulse) is depicted.

In an instance in which the current sensor of the main device element is provided on the semiconductor substrate 30, the Von measurement pulse signal may be input to the current sensor via the sensing probe and the drain-source voltage Vds of the current sensor may be obtained as the ON voltage Von of the main device element. In this instance, the BD energization pulse signal and the temperature measurement pulse signal are input to the main device element via the remaining probes other than the sensing probe. Therefore, the timing when the Von measurement pulse signal is ON may overlap the timing when the BD energization pulse signal is ON, the timing when the temperature measurement pulse signal is ON, etc., whereby the degrees of freedom of design are enhanced.

A strength (amplitude) of the Von measurement pulse signal is assumed to be a strength by which a rated drain-source current Ids flows in the MOSFET due to input of an ON signal of the Von measurement pulse signal. In particular, the strength of the Von measurement pulse signal, for example, is such that the drain-source current Ids flowing through the MOSFET due to input of the ON signal of the Von measurement pulse signal is at least 1 A. Further, the strength of the Von measurement pulse signal, for example, is at most a strength by which the obtained drain-source voltage Vds0 has a voltage value that is substantially a same as that of the forward voltage Vf of the body diode when the set current flows due to the BD energization pulse signal.

Next, input of the BD energization pulse signal ((a) in FIG. 3) is started, whereby the body diode energization begins (step S4). The BD energization pulse signal is a continuous pulse that is continuously ON (input of ON signal)/OFF (OFF signal input) for a predetermined cycle (first duty cycle). The timing when the temperature measurement pulse signal ((c) in FIG. 3) is ON and the timing when the Von measurement pulse signal ((d) in FIG. 3) is ON are so as not to overlap input of an ON signal of the BD energization pulse signal. A strength of the BD energization pulse signal, for example, is a strength by which the forward current If flowing through the body diode due to input of the ON signal of the temperature measurement pulse signal is in a range from at least 20 A to the rated current.

In particular, in a state in which the gate voltage is not applied to the gate pad, or gate voltage Vg that is negative is applied to the gate pad via the probes, the ON signal of the BD energization pulse signal having a predetermined strength is input between the source pad 14 and the drain electrode 15 via the probes, the predetermined forward current If (set current) flows through the body diode for the duration (the ON pulse width) of the ON signal of the BD energization pulse signal. As a result, the semiconductor substrate 30 generates heat and the temperature Tm of the semiconductor substrate 30 rises to a temperature corresponding to the forward current If of the body diode.

Thus, the temperature Tm of the semiconductor substrate 30 is calculated and whether the temperature Tm of the semiconductor substrate 30 is a set temperature (maximum temperature) T1 corresponding to the strength of the BD energization pulse signal is checked. At this time, by a same method and under same conditions as those for the body diode, the temperature Tm of the semiconductor substrate 30 is calculated. In particular, under same conditions as those before the body diode energization, the ON signal of the temperature measurement pulse signal is input, the predetermined forward current If (set current) is passed through the body diode, the forward voltage Vf of the body diode at this time is measured, and the forward voltage Vf is obtained as the voltage Vm1 applied to the semiconductor substrate 30 at the beginning of the body diode energization (at a high temperature).

The voltage Vm1 applied to the semiconductor substrate 30 at the beginning of the body diode energization, the temperature Tm of the semiconductor substrate 30 and the voltage Vm0 applied to the semiconductor substrate 30 before body diode energization, and equation (1) above are used to calculate the temperature Tm of the semiconductor substrate 301 at the beginning of the energization of the body diode at least one time. When the temperature Tm of the semiconductor substrate 301 reaches the set temperature T1, the ON voltage Von of the MOSFET is measured (step S5). In the process at step S5, by a same method and under same conditions as those for the process at step S3, the drain-source voltage Vds1 of the MOSFET at the beginning of the body diode energization is measured.

Next, after a predetermined energizing time of the body diode has elapsed, immediately before termination of the body diode energization, the voltage Vm1 applied to the semiconductor substrate 30 is measured and the temperature Tm of the semiconductor substrate 301 is calculated. Measurement of the voltage Vm1 applied to the semiconductor substrate 30 at this time and calculation of the temperature Tm of the semiconductor substrate 301 are each performed by a same method and under same conditions as those for measurement of the voltage Vm1 applied to the semiconductor substrate 30 immediately before step S5 and calculation of the temperature Tm of the semiconductor substrate 301. Next, the ON voltage Von of the MOSFET is measured (step S6). In the process at step S6, by a same method and under same conditions as those for the process at step S5, the drain-source voltage Vds1 of the MOSFET is measured immediately before termination of the body diode energization.

Next, input of the BD energization pulse signal is terminated, thereby terminating the body diode energization (step S7). The body diode energization is terminated, whereby the generation of heat by the semiconductor substrate 30 stops, the semiconductor substrate 30 is left as it is, allowing the semiconductor substrate (semiconductor chip) 30 to cool to room temperature (step S8). Next, the temperature Tm of the semiconductor substrate 30 is calculated and whether the temperature Tm of the semiconductor substrate 30 has reached room temperature (the stage temperature T0 before body diode energization) is checked. In other words, under same conditions as those before the body diode energization, the ON signal of the temperature measurement pulse signal is input and the forward voltage Vf of the body diode is obtained as a voltage Vm2 applied to the semiconductor substrate 30 after the body diode energization (at room temperature).

The voltage Vm2 applied to the semiconductor substrate 30 after the body diode energization, the temperature Tm of the semiconductor substrate 30 and the voltage Vm0 applied to the semiconductor substrate 30 before the body diode energization, and an equation in which Vm1 of equation (1) above is replaced with Vm2 are used to calculate the temperature Tm of the semiconductor substrate 302 after the body diode energization at least one time. After the temperature Tm of the semiconductor substrate 302 reaches room temperature (i.e., when Tm2=T0), the ON voltage Von of the MOSFET after the body diode energization is measured (step S9). In the process at step S9, by a same method and under same conditions as those for the process at step S3, the drain-source voltage Vds2 of the MOSFET after the body diode energization is measured.

Next, input of the temperature measurement pulse signal ((c) in FIG. 3) is terminated (step S10). Next, a fluctuation amount (Von fluctuation amount) ΔVon of the ON voltage Von of the MOSFET is calculated (step S11). In the process at step S11, the fluctuation amount ΔVon of the ON voltage Von of the MOSFET is calculated for 2 conditions including an instance when the temperature Tm of the semiconductor substrate 30 is a high temperature that is the set temperature T1 during body diode energization and an instance when the temperature Tm of the semiconductor substrate 30 is room temperature (the stage temperature T0 before the body diode energization). In particular, the fluctuation amounts ΔVon of the ON voltage Von of the MOSFET during high temperature and during room temperature are calculated using equation (2) and equation (3) below, respectively, $$\Delta Von \text{ (at high temperature)} = Vds1\_1 - Vds1\_2 \quad (2)$$

$$\Delta Von \text{ (at room temperature)} = Vds2 - Vds0 \quad (3)$$

In equation (2) above, ΔVon (at high temperature) is the fluctuation amount of the ON voltage Von of the MOSFET at a high temperature (the set temperature T1). The set temperature T1, for example, is at least 150 degrees C. Vds1_1 and Vds1_2 are values of the ON voltage Von (the drain-source voltage Vds) of the MOSFET body diode at the beginning of the energization and immediately before the energization is terminated, respectively. In equation (3) above, ΔVon (at room temperature) is the fluctuation amount of the ON voltage Von of the MOSFET at room temperature. Vds0 and Vds2 are values of the ON voltages Von (the drain-source voltages Vds) of the MOSFET before the body diode energization and after the energization, respectively.

The fluctuation amounts ΔVon of the ON voltage Von of the MOSFET at a high temperature and at room temperature are calculated using equation (2) and equation (3), respectively. The semiconductor substrate 30 without a change in the ON voltage Von of the MOSFET during a high temperature and during room temperature is screened (identified), whereby the silicon carbide semiconductor device 10 in which no stacking faults have grown may be screened as a conforming product. No change in the ON voltage Von of the MOSFET is an instance in which the fluctuation amount ΔVon of the ON voltage Von of the MOSFET at a high temperature is at most about ±1% and the fluctuation amount ΔVon of the ON voltage Von of the MOSFET at room temperature is at most about ±2%.

The semiconductor substrate 30 may be screen by only the fluctuation amount ΔVon of the ON voltage Von of the MOSFET at a high temperature. In the present embodiment, the semiconductor substrate 30 may be screened based on 2 judgment criteria including the fluctuation amount ΔVon of the ON voltage Von of the MOSFET at a high temperature and the fluctuation amount ΔVon of the ON voltage Von of the MOSFET at room temperature. Through diligent research of the inventor, it was confirmed that by increasing the judgment criteria for screening, screening accuracy of the semiconductor substrate 30 is enhanced. The probes are subsequently separated from the semiconductor chip (step S12), thereby terminating the screening inspection of the semiconductor substrate 30.

A single inspection apparatus may perform the process (connecting the probes to the semiconductor substrate 30) at step S1 described above to the process (separating the probes from the semiconductor substrate 30) at step S12 and therefore, increases in the number of processes of the screening inspection may be suppressed. Further, when the body diode energization is terminated, substantially concurrently therewith, fluctuation of the ON voltage Von of the MOSFET may be grasped. Further, in the method of inspecting the silicon carbide semiconductor device 10 according to the embodiment described above, the process at step S9 and the process at step S10 may be interchanged. Further, the process at step S11 and the process at step S12 may be interchanged.

Further, in the process at step S11, calculation of the fluctuation amount ΔVon of the ON voltage Von of the MOSFET at a high temperature may be performed at any timing from the process (setting of the drain-source voltage Vds1 (the ON voltage Von) of the MOSFET immediately before termination of the body diode energization) at step S6 or thereafter. In the process at step S11, the calculation of the fluctuation amount ΔVon of the ON voltage Von of the MOSFET at room temperature may be performed at any timing from the process (setting of the drain-source voltage Vds2 (the ON voltage Von) of the MOSFET after the body diode energization) at step S9 or thereafter.

Further, between the process at step S5 and the process at step S6 (during body diode energization), calculation of the temperature Tm of the semiconductor substrate 301, measurement of the voltage Vm1 applied to the semiconductor substrate 30 during the temperature Tm of the semiconductor substrate 301, and measurement of the drain-source voltage Vds1 (the ON voltage Von) of the MOSFET may be further performed as one set at least one time. In this instance, calculation of the fluctuation amount ΔVon of the ON voltage Von of the MOSFET at a high temperature may be performed using any of the drain-source voltages Vds1 of the MOSFET desired to be measured during the body diode energization, in equation (2) described above.

The measuring device, the probes, the stage of the inspection apparatus, etc. are controlled by a control unit (not depicted). Further, the method of inspecting the silicon carbide semiconductor device according to the present embodiment (the semiconductor substrate 30) may be realized by executing a prepared program on a computer such as a personal computer or a workstation, a database server, or a web server. Inspection results and detection results obtained by executing the program and information acquired in advance to obtain the inspection results and the detection results are recorded to a computer-readable recording medium (not depicted).

Further, voltage waveforms of the voltages Vm0, Vm1, Vm2 (the forward voltage Vf of the body diode) applied to the semiconductor substrate 30 and measured during an interval from step S1 to step S12 described above may be output to a display unit such as a monitor to be in a state enabling continuous observation. Voltage waveforms of the ON voltages Von (the drain-source voltages Vds0, Vds1, Vds2 of the MOSFET) of the MOSFET measured during the interval from step S1 to step S12 described above may be output to a display unit different from that for the voltage waveforms of the voltages Vm0, Vm1, Vm2 applied to the semiconductor substrate 30, to be in a state enabling continuous observation.

Further, the program is recorded to the computer-readable recording medium and is executed by being readout from the recording medium by a computer or a server. The recording medium is a solid-state drive (SSD), a hard disk drive (HDD), a Blu-ray Disk (BD) (registered trademark), a flexible disk, a USB flash memory, a CD-ROM, an MO, a DVD, etc. Further, the program may be a transmission medium enabling distribution via a network such as the Internet.

As described above, according to the embodiment, after the body diode energization is started by an input of the BD energization pulse signal having a predetermined cycle but before the input of the BD energization pulse signal is terminated to terminate the body diode energization, the drain-source voltage of the MOSFET is measured at least 2 times at different timings with respect to the semiconductor chip that has generated heat. Subsequently, screening is performed based on a difference (fluctuation amount: judgment criterion) of the measured drain-source voltages. Screening is performed based on the drain-source voltage of the MOSFET, the drain-source voltage having minimal measurement variability compared to the forward voltage of the body diode, whereby screening accuracy may be enhanced compared to an instance in which screening is performed based on the forward voltage of the body diode.

Further, according to the embodiment, the drain-source voltage of the MOSFET is further measured at room temperature both before and after the body diode energization and screening is performed based on a difference of the measurements. Screening is performed based on judgment criteria respectively obtained from the semiconductor chip at different temperatures, whereby the screening accuracy may be further enhanced. Further, according to the embodiment, a set of input terminals (probes) for energizing the body diode are used and the drain-source voltage of the MOSFET is measured during the body diode energization (as well as before and after energization), whereby judgment criteria for the screening may be obtained substantially concurrently with the termination of the body diode energization. Therefore, the number of processes of the screening inspection may be reduced.

Further, according to the embodiment, forward current flows through the body diode due to the input of the BD energization pulse signal, whereby the duration (OFF pulse width) of the OFF signal of the BD energization pulse signal may be set to a period of time whereby forward current does not flow through the body diode even when forward current is passed through the body diode at a high current density. Therefore, overheating of the semiconductor chip may be prevented. Further, according to the embodiment, body diode energization and voltage measurement for obtaining judgment criteria for screening may be performed between pressing the probes against the semiconductor substrate and separating the probes from the semiconductor substrate. Therefore, variation of contact resistance due to the probes may be suppressed by the body diode energization and screening inspection.

Figure 4:
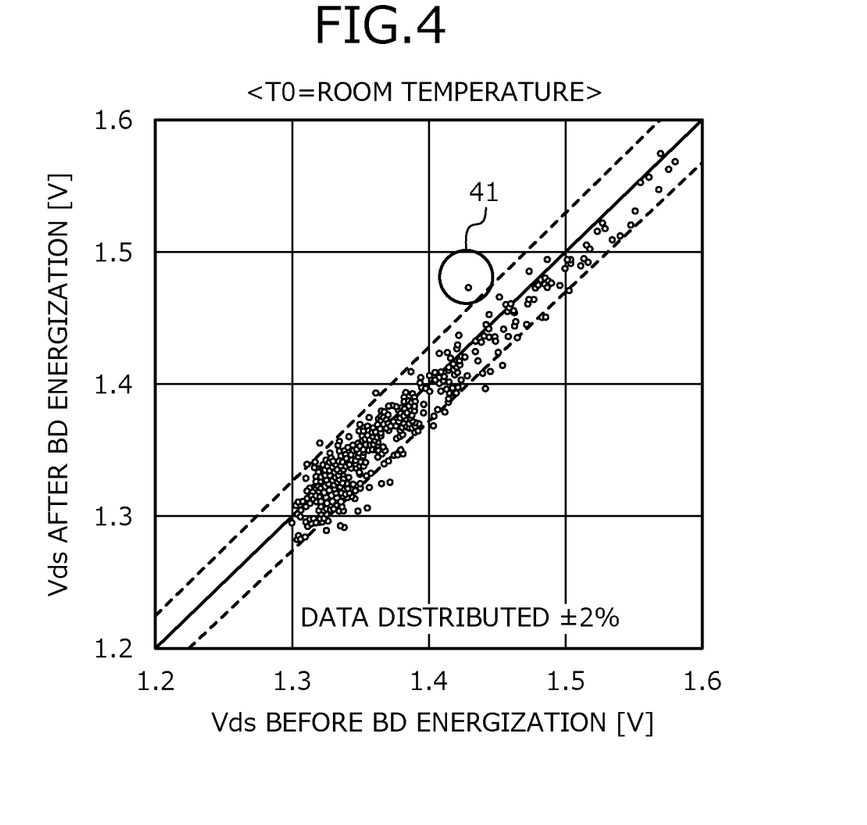
FIG. 4 is a characteristics diagram depicting measurement variability of the drain-source voltage of a MOSFET of an experimental example at room temperature.
Figure 5:
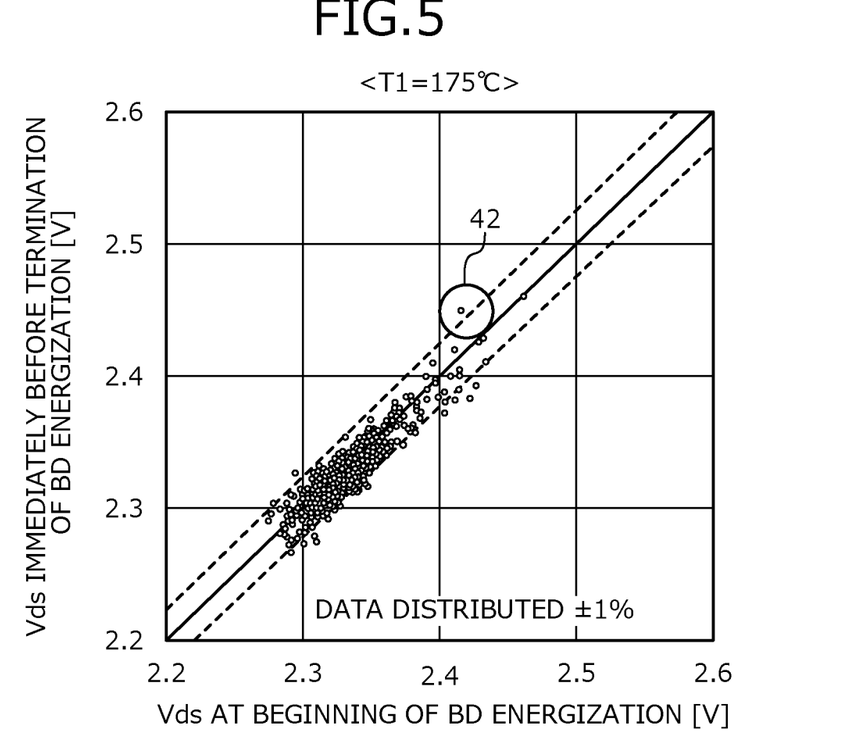
FIG. 5 is a characteristics diagram depicting measurement variability of a drain-source voltage of a MOSFET of an experimental example at a high temperature (set temperature T1=175 degrees C.).
Figure 6:
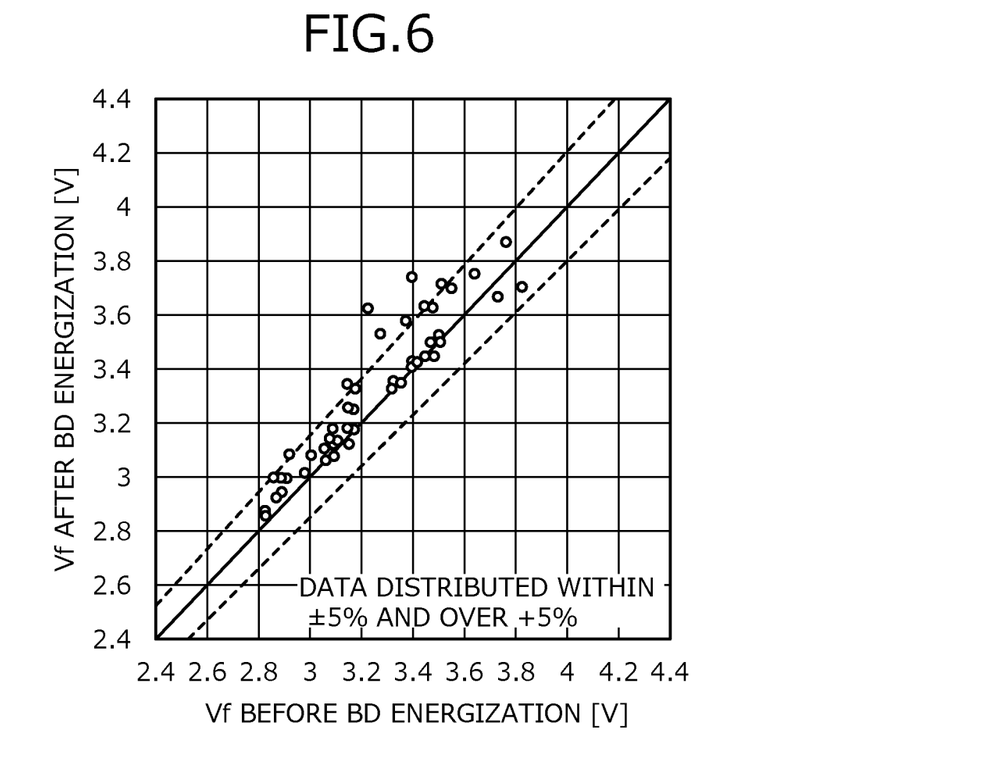
FIG. 6 is a characteristics diagram depicting measurement variability of forward voltage of a body diode of a comparison example.

A relationship between measurement variability of the drain-source voltage Vds of a MOSFET and the presence/absence of stacking fault growth was verified. FIG. 4 is a characteristics diagram depicting measurement variability of the drain-source voltage of a MOSFET of an experimental example at room temperature. FIG. 5 is a characteristics diagram depicting measurement variability of the drain-source voltage of the MOSFET of the experimental example at a high temperature (the set temperature T1=175 degrees C.). FIG. 6 is a characteristics diagram depicting measurement variability of forward voltage of a body diode of a comparison example.

In FIG. 4, a horizontal axis and a vertical axis respectively represent the drain-source voltage Vds of the MOSFET before and after body diode energization (before BD energization and after BD energization). In FIG. 5, a horizontal axis and a vertical axis respectively represent the drain-source voltage Vds of the MOSFET at the beginning of the body diode energization and immediately before the energization is terminated (beginning of the BD energization and immediately before the BD energization is terminated). In FIG. 6, a horizontal axis and vertical axis respectively represent the forward voltage Vf of the body diode before and after energization.

For multiple semiconductor substrates (semiconductor chips) 30 (hereinafter, the experimental example), results of measurement of the drain-source voltage Vds of the MOSFETs at room temperature and at a high temperature according to the method of inspecting the silicon carbide semiconductor device 10 according to the embodiment described above are shown in FIGS. 4 and 5. The strength of the Von measurement pulse signal for measuring the drain-source voltage Vds of the MOSFETs differed for each sample of the experimental example.

In FIG. 4, a reference line in an instance in which the drain-source voltage Vds does not fluctuate before or after the body diode energization is indicated by a solid line. In FIG. 5, a reference line in an instance in which the drain-source voltage Vds does not fluctuate at the beginning of the body diode energization or immediately before the energization is terminated is indicated by a solid line. Further, in FIGS. 4 and 5, respectively, a range in an instance in which fluctuation from the reference line is ±2% and a range in an instance in which fluctuation is ±1% are indicated as screening passing ranges by dashed lines. A screening passing range is an allowable range of measurement variability and is a range for judging, by the screening inspection, that no stacking faults have grown.

Further, for multiple semiconductor substrates 30 (hereinafter, the comparison example), results of measurement of the forward voltage Vf before and after body diode energization are shown in FIG. 6. The strength of the BD energization pulse signal for energizing the body diodes differed for each sample of the comparison example. In FIG. 6, a reference line in an instance in which the forward voltage Vf does not fluctuate before or after the body diode energization is indicated by a solid line and a range in an instance in which fluctuation from the reference line is ±5% is indicated as the screening passing range by a dashed line.

From the results of the experimental example depicted in FIG. 4, it was confirmed that the passing range for the drain-source voltage Vds of the MOSFET at room temperature could be set to within the range of ±2% from the reference line. It was possible to judge that a sample 41 for which the drain-source voltage Vds of the MOSFET at room temperature was outside the allowable range was a sample in which the drain-source voltage Vds of the MOSFET fluctuated. Growth of stacking faults in the sample 41 was confirmed.

From the results of the experimental example depicted in FIG. 5, it was confirmed that the passing range for the drain-source voltage Vds of the MOSFET at a high temperature could be set to be within ±1% from the reference line. It was possible to judge that a sample 42 for which the drain-source voltage Vds of the MOSFET at a high temperature was outside the allowable range was a sample in which the drain-source voltage Vds of the MOSFET fluctuated. Growth of stacking faults in the sample 42 was confirmed.

A reason that the passing range for the drain-source voltage Vds of the MOSFET at a high temperature may be set narrower as compared to that at room temperature is that during high temperatures, an absolute value of the drain-source voltage Vds of the MOSFET is large as compared to that at room temperature. At room temperature, the absolute value of the drain-source voltage Vds of the MOSFET is small and therefore, the fluctuation amount of the drain-source voltage Vds of the MOSFET before and after body diode energization is large.

Further, from the results of the comparison example depicted in FIG. 6, it was confirmed that measurement variability of the forward voltage Vf before and after body diode energization tended to be greater than the measurement variability of the drain-source voltage Vds of the MOSFET at room temperature and at a high temperature (refer to FIGS. 4 and 5). A reason for this is presumed as follows. The drain-source voltage Vds of the MOSFET is not dependent on temperature variation of the $p^{++}$-type contact regions 6 (refer to FIG. 1A).

On the contrary, it is presumed that the forward voltage Vf of the body diode is dependent on the contact resistance of the $p^{++}$-type contact regions 6 (refer to FIG. 1B) and that the contact resistance varies due to temperature increases of the semiconductor substrate 30. Further, in the comparison example, for many of the samples, while a tendency was seen for the forward voltage Vf to increase after body diode energization, the growth of stacking faults was not found in any of the samples.

Further, in the comparison example, even for samples in which the forward voltage Vf after body diode energization fluctuate by more than +5% from the reference line, the growth of stacking faults was not found. Therefore, from the results shown in FIGS. 4 to 6, it was confirmed that by comparing the drain-source voltage Vds of the MOSFET before and after body diode energization, the screening accuracy may be enhanced to a greater extent as compared to an instance of comparing the forward voltage Vf before and after body diode energization.

In the experimental example described above, while the passing range for the drain-source voltage Vds of the MOSFET for judgment as a conforming product by the screening inspection is set to be within a range of ±2% and a range of ±1% at room temperature and at a high temperature, respectively, the range of the measurement variability of the drain-source voltage Vds of the MOSFET for judgment as a conforming product by the screening inspection is variously set according to design conditions of the silicon carbide semiconductor device 10.

In the foregoing, the present invention is not limited to the embodiments and various modifications within a range not departing from the spirit of the invention are possible. For example, in the embodiment described above, while an instance in which the measurement of the ON voltage Von (the drain-source voltage Vds) of the MOSFET is performed 4 times (before body diode energization, at the beginning of the energization, immediately before the energization is terminated, and after the energization) is described as an example, without limitation hereto, in addition to the 4 timings described above, measurement of the ON voltage Von of the MOSFET may be suitably performed at different timings during the body diode energization.

Further, for example, in the embodiments described above, dimensions and impurity concentrations of parts of the silicon carbide semiconductor device, conditions (amplitude, cycle, pulse width) for pulse signals input to the silicon carbide semiconductor device, etc. may be variously set according to necessary specifications. Further, in the embodiments described above, while an instance in which silicon carbide is used as a wide bandgap semiconductor is described as an example, other than silicon carbide, for example, a wide bandgap semiconductor such as gallium nitride (GaN) may be applied. Further, the invention is similarly implemented when the conductivity types (n-type, p-type) are reversed.

According to the invention described above, a first voltage that is a judgment criterion for screening is measured during body diode energization and substantially concurrently with the termination of the body diode energization, thereby enabling a judgment criterion for screening to be obtained.

The method of inspecting a silicon carbide semiconductor device according to the present invention achieves an effect in that the number of processes for screening semiconductor chips may be reduced.

As described above, the method of inspecting a silicon carbide semiconductor device according to the present invention is useful for inspecting silicon carbide semiconductor devices in which a parasitic pn diode (body diode) formed by a pn junction in the semiconductor substrate is configured and is particularly suitable inspecting MOSFETs.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of inspecting a silicon carbide semiconductor device having a semiconductor chip containing silicon carbide; a first semiconductor region of a first conductivity type, provided in the semiconductor chip; a second semiconductor region of a second conductivity type, provided between a first surface of the semiconductor chip and the first semiconductor region; a plurality of third semiconductor regions of the first conductivity type, each selectively provided between the first surface of the semiconductor chip and the second semiconductor region; a gate insulating film provided in contact with a portion of the second semiconductor region between the first semiconductor region and one of the third semiconductor regions; a gate electrode provided on the second semiconductor region via the gate insulating film; a first electrode electrically connected to the second semiconductor region and the third semiconductor regions; and a second electrode provided on a second surface of the semiconductor chip, the method comprising:

energizing a parasitic diode by inputting a first pulse signal having a first duty cycle, as a first process, the parasitic diode being formed by a pn junction between the second semiconductor region and the first semiconductor region;

passing a predetermined first current through the semiconductor chip in a direction from the second electrode to the first electrode by inputting a second pulse signal, and measuring a first voltage applied to the second electrode and positive with respect to the first electrode while the second pulse signal is ON, as a second process;

terminating input of the first pulse signal, thereby terminating energization of the parasitic diode, as a third process;

calculating, as a fourth process, a first difference between two measured values of the first voltage obtained at different times after the first process but before the third process, by performing the second process on the semiconductor chip, the semiconductor chip having generated heat due to the first process; and identifying the semiconductor chip for which the first difference is within a first predetermined range to be a conforming product, as a fifth process.

2. The method according to claim 1, further comprising
calculating, as a sixth process, a second difference between a first measured value of the first voltage obtained by performing the second process on the semiconductor chip before the first process and a second measured value of the first voltage obtained by performing the second process after the third process, on the semiconductor chip, wherein the sixth process includes determining whether the first difference is within the first predetermined range and the second difference is within a second predetermined range, and if so identifying the semiconductor chip as a conforming product.

3. The method according to claim 1, wherein
the fourth process includes calculating the first difference between a first measured value of the first voltage obtained by performing the second process at a start of the energization of the parasitic diode and a second measured value of the first voltage obtained by performing the second process after a predetermined energizing time for the parasitic diode has elapsed.

4. The method according to claim 1, further comprising:
passing a second current in a forward direction through the parasitic diode by inputting a third pulse signal, and measuring a second voltage applied to the first electrode and positive with respect to the second electrode while the third pulse signal is ON, as a seventh process; and calculating a temperature of the semiconductor chip, based on the second voltage as an eighth process, wherein the second process is performed after obtaining the temperature of the semiconductor chip by the seventh process and the eighth process, and confirming that the temperature of the semiconductor chip is a predetermined set temperature.

5. The method according to claim 4, wherein
in the seventh process, the second voltage is measured when the second current that is $1/1000$ of a rating of the parasitic diode is passed through the parasitic diode, and in the eighth process, the temperature of the semiconductor chip is calculated based on a first measured value of the second voltage obtained by performing the seventh process before the first process and a second measured value of the second voltage obtained by performing the seventh process after the first process.

6. The method according to claim 4, wherein
in the seventh process, the third pulse signal turns ON at a first time different from a second time when the first pulse signal turns ON and a third time when the second pulse signal turns ON.

7. The method according to claim 1, wherein
in the second process, the second pulse signal turns ON at a first time different from a second time when the first pulse signal turns ON.

* * * * *